United States Patent [19]
Ishimura et al.

[11] Patent Number: 5,087,957
[45] Date of Patent: Feb. 11, 1992

[54] CMOS MEMORY DEVICE WITH IMPROVED SENSE AMPLIFIER BIASING

[75] Inventors: Tamihiro Ishimura; Masahumi Miyawaki; Sanpei Miyamoto; Hidenori Uehara, all of Tokyo, Japan

[73] Assignee: Oki Electric Industry Co., Ltd., Tokyo, Japan

[21] Appl. No.: 672,359

[22] Filed: Mar. 20, 1991

[30] Foreign Application Priority Data

Mar. 22, 1990 [JP] Japan .................................. 1-72639

[51] Int. Cl.[5] .................. H01L 27/102; H01L 27/105; G11C 7/00
[52] U.S. Cl. ........................................ 357/42; 357/44; 357/45; 365/189.05; 365/189.06; 365/189.09; 365/190
[58] Field of Search .................. 357/42, 40, 44, 45; 365/189.05, 189.06, 189.09, 190, 226

[56] References Cited

U.S. PATENT DOCUMENTS

| | | | |
|---|---|---|---|
| 4,712,124 | 12/1987 | Stupp | 357/42 |
| 4,728,998 | 3/1988 | Strain | 357/42 |
| 4,760,035 | 7/1988 | Pfleiderer et al. | 357/42 |
| 4,935,799 | 6/1990 | Mori et al. | 357/43 |
| 4,965,651 | 10/1990 | Wagner | 357/42 |
| 5,023,689 | 6/1991 | Sugawara | 357/42 |

FOREIGN PATENT DOCUMENTS 0097858  5/1986  Japan ...................................... 357/42

*Primary Examiner*—Georgia Epps
*Attorney, Agent, or Firm*—Edward D. Manzo

[57] ABSTRACT

A CMOS memory device has a memory cell array, formed on a substrate of a first conductive type, for storing data. The data are input and output via bit line pairs connected to the memory cell array. Sense amplifiers of the first conductive type, which are embedded in wells of a second conductive type, amplify potential differences on the bit line pairs. The sense amplifiers are connected to and driven by a sense amplifier drive signal line. The sense amplifier drive signal line also biases the wells containing the sense amplifiers, thereby preventing latch-up.

7 Claims, 6 Drawing Sheets

CMOS MEMORY DEVICE WITH IMPROVED SENSE AMPLIFIER BIASING

BACKGROUND OF THE INVENTION

This invention relates to a complementary metal-oxide-semiconductor (CMOS) memory device such as a dynamic random access memory (RAM), more particularly to a CMOS memory device with improved sense amplifier biasing.

A CMOS device is formed on a substrate of one conductive type having wells or tubs of the opposite conductive type: for example, on a p-type substrate having n-type wells (hereinafter referred to as n-wells). In the device, p-channel metal-oxide-semiconductor (PMOS) transistors are disposed in the n-wells and n-channel metal-oxide-semiconductor (NMOS) transistors are disposed in the p-type substrate outside the n-wells, forming a complementary structure with well-known advantages of low power dissipation.

A CMOS memory device generally has p-channel and n-channel sense amplifiers to amplify data read from the memory cells of the device onto bit lines. Sense amplifiers of one channel type are disposed in wells of the opposite conductive type: for example, p-channel sense amplifiers are disposed in n-wells. The wells are biased to prevent short-circuiting of the power supply, a potentially destructive phenomenon known as latch-up. Prior-art designs use power lines for biasing the wells.

One disadvantage of this scheme is that power lines are subject to voltage fluctuations caused, for example, by variations in the supply voltage, and are also susceptible to voltage drops due to the impedance of the power lines. Such voltage fluctuations and drops can activate parasitic transistors in the well structures, leading to latch-up.

With reference to FIG. 1, for example, a prior-art sense amplifier comprises a pair of PMOS transistors 2 connected to bit lines BL and $\overline{BL}$ disposed in an n-well 4 in a p-type substrate 6. The sense amplifier is driven by a signal denoted PS which is supplied to the sources 8 of the transistors 2. The n-well 4 is biased by a pair of contacts 10 and 11 connected to power lines VN. Outside the n-well, as part of an adjacent circuit, is a ground contact 12 connected to a ground line Vss.

If a large drop occurs in the VN voltage, parasitic bipolar transistors 14 and 15 in the n-well may turn on, so that when the PS signal is activated a current i1 flows from the source 8 of the PMOS transistors 2 to the p-type substrate 6. Current from the parasitic transistor 15 turns on another parasitic transistor 16 connecting the power contact 11 to the ground contact 12. The power supply is then short circuited; current i2 flows directly from the VN line to ground; latch-up has occurred.

Another disadvantage of this scheme is that the extra required power lines take up space, leading to undesirably large chip size. FIGS. 2A and 2B, for example, show two typical layouts of the VN bias power lines. In FIG. 2A a main bias power line VNa from a power pad 18 feeds a plurality of lines VN that bias the wells of sense amplifiers $20_1$ to $20_n$. In FIG. 2B there are two main power lines VNa and VNb for feeding bias power to both ends of the biasing lines VN. The lines VNa and VNb are used solely for biasing; they do not supply operating power to any circuits. The need to provide such power lines constrains memory design and reduces the space available for memory cells. In FIG. 2B the power line VNb crosses the signal lines $PS_1$ to $PS_n$ by which sense amplifier drive circuits $22_1$ to $22_n$ drive the sense amplifiers $20_1$ to $20_n$. Accordingly, the line VNb and the lines $PS_1$ to $PS_n$ must be routed in different metal layers, further constraining the circuit design.

With reference to FIGS. 2C and 2D, some prior-art designs attempt to conserve space by using the same power line VNa or lines VNa and VNb both to bias sense-amplifier wells and to supply power to peripheral circuits 24 in the device. Unfortunately, such designs tend to give rise to increased impedance on the power lines, reducing the voltage supplied to the peripheral circuits 24, so that they do not always operate reliably.

SUMMARY OF THE INVENTION

It is accordingly an object of the present invention to prevent latch-up in a CMOS memory device.

Another object of the invention is to conserve space in a CMOS memory device.

Still another object is to enable peripheral circuits in a CMOS memory device to operate reliably.

A CMOS memory device formed on a substrate of a first conductive type comprises a memory cell array for storing data, a plurality of bit line pairs connected to the memory cell array for output of the data, a plurality of wells of a second conductive type disposed in the substrate, and a plurality of sense amplifiers connected to respective bit line pairs for amplifying potential differences on the bit line pairs, one sense amplifier being disposed in each well of the aforementioned plurality of wells. The sense amplifiers are connected to and driven by a sense amplifier drive signal line. The sense amplifier drive signal line also biases the wells in which the sense amplifiers are disposed.

DETAILED DESCRIPTION OF THE INVENTION

As an illustration of the present invention, a novel CMOS memory device will be described with reference to FIGS. 3 to 5. The novel CMOS memory device is a dynamic RAM, but the invention is not restricted to this type of CMOS memory device; it is applicable to other types of memory as well. It will be assumed that the device is fabricated on a p-type semiconductor substrate, but this too is not a restriction; the invention is also applicable to devices fabricated on n-type substrates.

Figure 3:
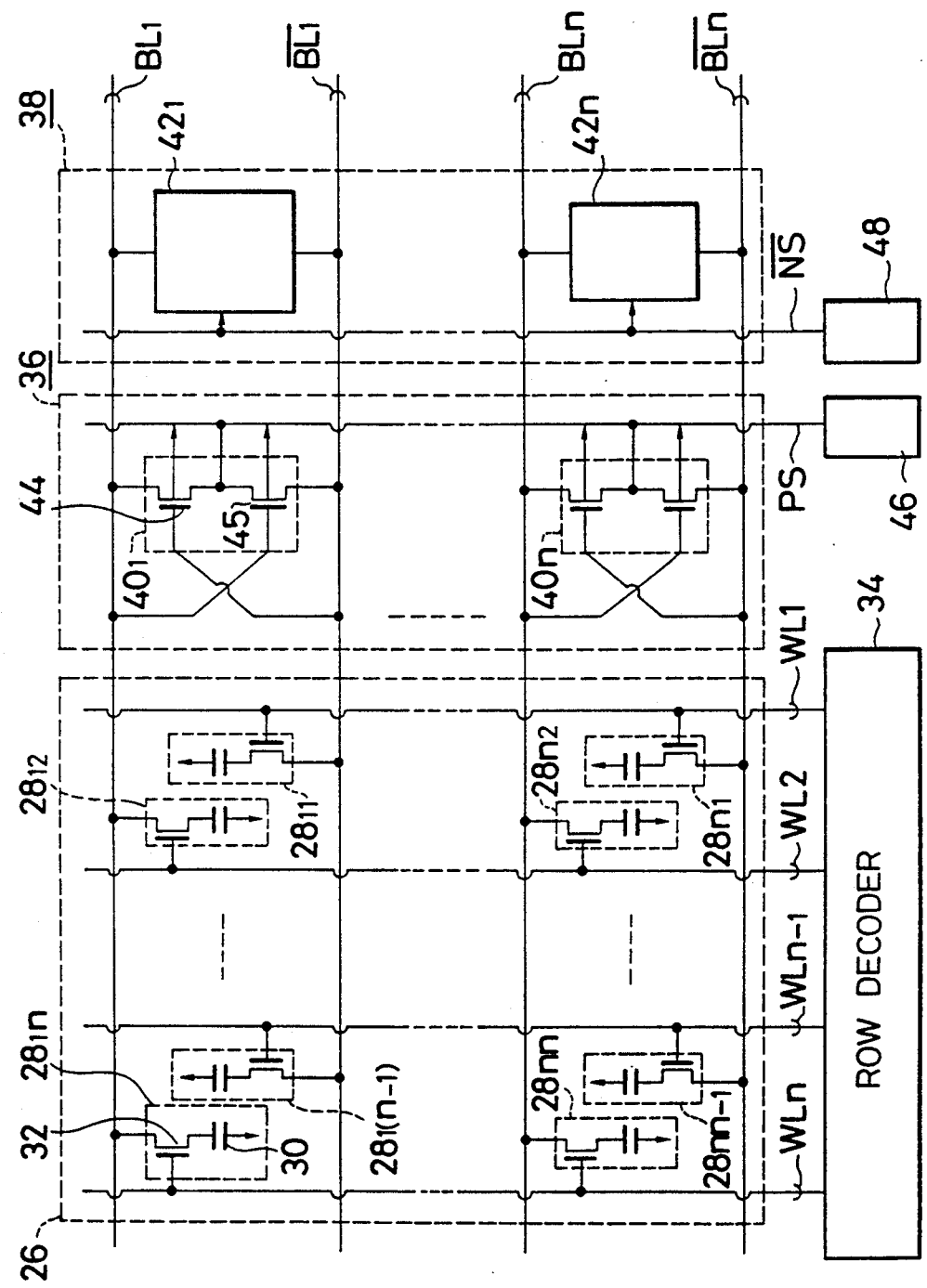
FIG. 3 is a plan view illustrating the layout of a novel CMOS memory device.

With reference to FIG. 3, the novel CMOS memory device comprises a memory cell array 26 for storing data and a plurality of bit line pairs $BL_1 \cdot \overline{BL}_1$ to $BL_n \cdot \overline{BL}_n$ connected to the memory cell array 26 for input and output of the data. More specifically, the memory cell array 26 comprises $n^2$ memory cells $28_{11}$ to $28_{nn}$, where n is an even integer. Memory cells $28_{11}$, $28_{13}, \ldots, 28_{1(n-1)}$ are connected to the bit line $\overline{BL}_1$; memory cells $28_{12}, 28_{14}, \ldots, 28_{1n}$ are connected to the bit line $BL_1$; memory cells $28_{n1}, 28_{n3}, \ldots, 28_{n(n-1)}$ are connected to the bit line $\overline{BL}_n$; memory cells $28_{n2}, 28_{n4}, \ldots, 28_{nn}$ are connected to the bit line $BL_n$; and intermediate memory cells (not shown in the drawing) are connected in like manner to intermediate bit lines (also not shown).

Each memory cell comprises a capacitor 30 and a transistor 32. The transistors 32 are connected to word lines $WL_1$ to $WL_n$, which are driven by a row decoder 34. The structure and operation of the memory cell array 26 and row decoder 34 are well known and will not be described further.

The CMOS memory device in FIG. 3 also has a first column of sense amplifiers 36 and a second column of sense amplifiers 38. The sense amplifiers in these two columns are of opposite conductive types: the first column of sense amplifiers 36 comprises p-channel sense amplifiers $40_1$ to $40_n$, while the second column of sense amplifiers comprises n-channel sense amplifiers $42_1$ to $42_n$. Since the entire device is formed on a p-type substrate, the p-channel sense amplifiers $40_1$ to $40_n$ are disposed in n-type wells (hereinafter referred to as n-wells). The n-wells are not explicitly shown in FIG. 3, but will be illustrated in FIG. 4. The invention relates specifically to the sense amplifiers having channels of the same conductive type as the substrate; that is, to the p-channel sense amplifiers $40_1$ to $40_n$ in the first column of sense amplifiers 36 in FIG. 3.

The p-channel sense amplifiers $40_1$ to $40_n$ are connected to respective bit line pairs: the sense amplifier $40_1$ is connected to the bit lines $BL_1$ and $\overline{BL}_1$; the sense amplifier $40_n$ is connected to the bit lines $BL_n$ and $\overline{BL}_n$. Each of the p-channel sense amplifiers $40_1$ to $40_n$ comprises a first PMOS transistor 44 and a second PMOS transistor 45, the gate and drain electrodes of which are connected to the bit lines. The source electrodes of the PMOS transistor 44 and 45 are connected in common to a sense amplifier drive signal line PS. The function of the sense amplifier $40_1$ to $40_n$ is to amplify potential differences on respective bit line pairs $BL_1 \cdot \overline{BL}_1$ to $BL_n \cdot \overline{BL}_n$ when the sense amplifier drive signal line PS is in the active state (high).

Similarly, the n-channel sense amplifiers $42_1$ to $42_n$, which comprises NMOS transistors not explicitly shown in the drawing, are driven by another sense amplifier drive signal line line $\overline{NS}$. The PS and $\overline{NS}$ signal lines are activated by a p-channel sense amplifier drive circuit 46 and an n-channel sense amplifier drive circuit 48, respectively.

Figure 4:
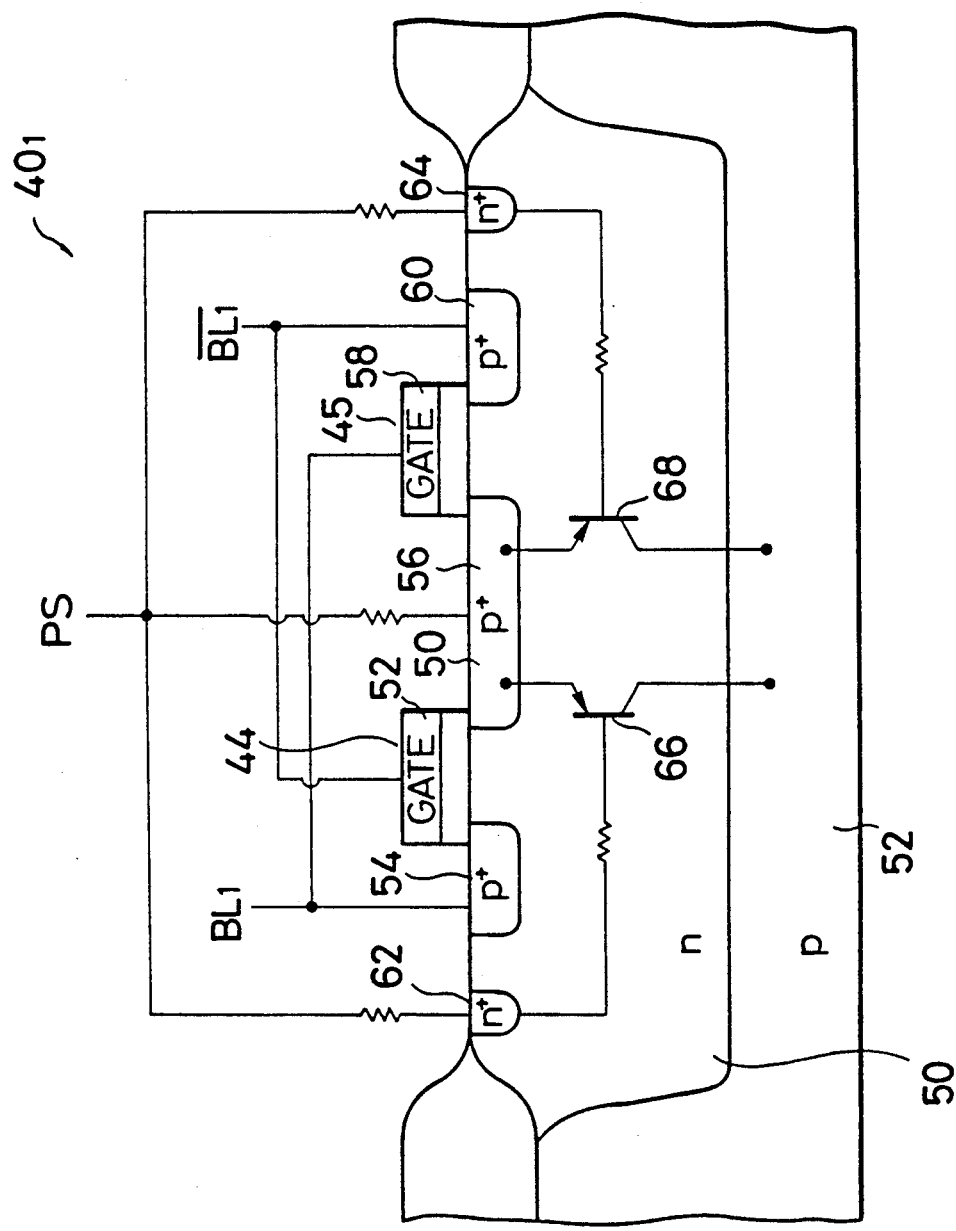
FIG. 4 is a sectional view of a sense amplifier illustrating the novel biasing scheme.

With reference to FIG. 4, the sense amplifier $40_1$, comprising a first transistor 44 a second transistor 45, is disposed in an n-well 50 in the p-type substrate 52. The first transistor 44 comprises a source 50 connected to the sense amplifier drive signal line PS, a gate 52 connected to the first bit line $\overline{BL}_1$ in the bit line pair $BL_1 \cdot \overline{BL}_1$, and a drain 54 connected to the second bit line $BL_1$ in the bit line pair $BL_1 \cdot \overline{BL}_1$. The second transistor 45 comprises a source 56 conencted to the sense amplifier drive signal line PS, a gate 58 connected to the second bit line $BL_1$, and a drain 60 connected to the first bit line $\overline{BL}_1$. The sources 50 and 56 and the drains 54 and 60 comprise regions in the n-well 50 that are strongly doped with a p-type impurity.

The sense amplifier $40_1$ also comprises a first bias contact 62 and a second bias contact 64, both of which are connected to the sense amplifier drive signal line PS. The function of the bias contacts 62 and 64 is to bias the n-well 50 to prevent the latch-up phenomenon described earlier. The bias contacts 62 and 64 comprise regions in the n-well 50 that are strongly doped with an n-type impurity.

The biasing works as follows. The n-well 50 can be considered to contain a pair of parasitic lateral PNP transistors 66 and 68 having their emitters connected via the sources 50 and 56 to the sense amplifier drive signal line PS, their bases connected to the bias contacts 62 and 64, and their collectors connected to the p-type semiconductor substrate 52. Latch-up is prevented by preventing the parasitic transistors 66 and 68 from turning on; this is accomplished by keeping their emitters and bases at the same potential.

The operation of reading data from this CMOS memory device will now be described with reference to FIGS. 3, 4, and 5.

To read data from the memory cell $28_{1n}$ in FIG. 3, for example, the row decoder 34 decodes a row address signal that causes it to drive the word line $WL_n$ to the active state (high). The transistors 32 in the memory cells $28_{1n}, \ldots, 28_{nn}$ then turn on, connecting the capacitors 30 in the memory cells $28_{1n}, \ldots, 28_{nn}$ to the bit lines $BL_1, \ldots, BL_n$.

Figure 5:
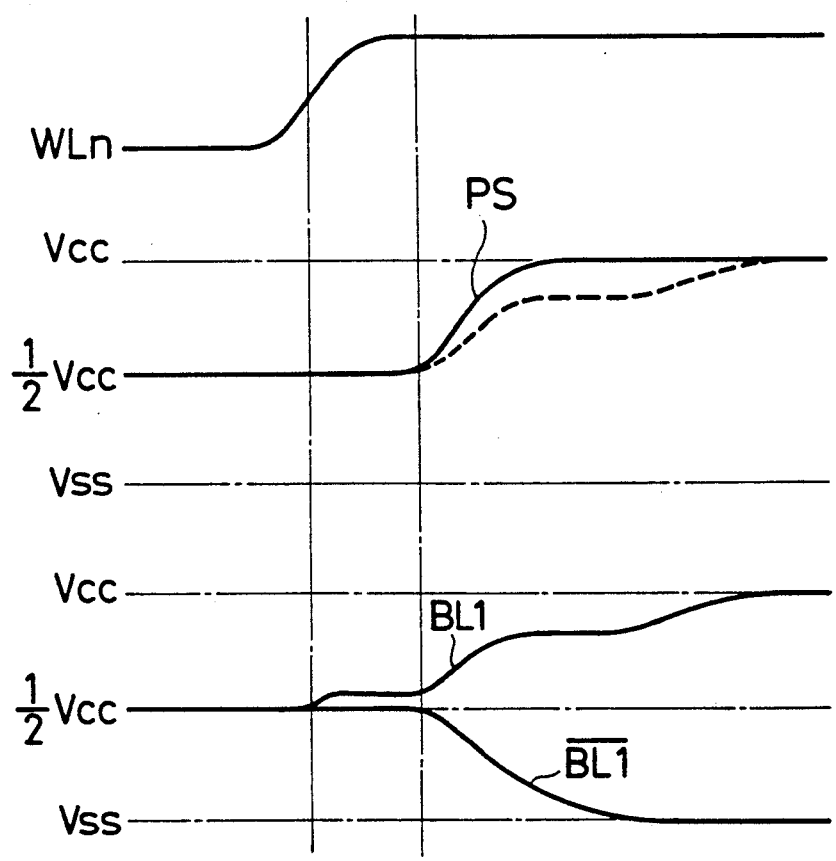
FIG. 5 is a graph illustrating the operation of the sense amplifiers in the novel CMOS memory device.

FIG. 5 indicates voltage waveforms on the word line $WL_n$, the sense amplifier drive signal line PS, the bit line $BL_1$, and the bit line $\overline{BL}_1$. The sense amplifier drive signal line PS and the bit lines $BL_1$ and $\overline{BL}_1$ are precharged to a voltage $\frac{1}{2} \cdot Vcc$ equal to half the supply voltage. When the word line $WL_n$ becomes active, if the capacitor 30 connected to the bit line $BL_1$ is charged, indicating for example the logic value one, the potential of the bit line $BL_1$ is raised to a value slightly higher than $\frac{1}{2} \cdot Vcc$ as shown in the drawing. (If the capacitor 30 connected to the bit line $BL_1$ were discharged, indicating the logic value zero, the potential of $BL_1$ would fall to a value slightly lower than $\frac{1}{2} \cdot Vcc$.)

After the word line $WL_n$ has gone high, the sense amplifier drive signal line PS is driven to the active level (Vcc) as indicated by the solid line labeled PS in FIG. 5. Due to the slight potential difference on the first and second bit lines $\overline{BL}_1$ and $BL_1$, a difference arises between the conductances of the first and second PMOS transistors 44 and 45. The manner in which these transistors 44 and 45 are interconnected with the bit lines $\overline{BL}_1$ and $BL_1$ causes this difference in conductance to increase and the second bit line $BL_1$ to be pulled up to the Vcc level. The relevant circuit theroy is well known and will not be elaborated on.

At the same time, the n-channel sense amplifier $42_1$ is driven by the sense amplifier drive signal line $\overline{NS}$ and operates in like manner to pull the first bit line $\overline{BL}_1$ down to the ground level (Vss). The small potential difference on the bit line pair $BL_1 \cdot \overline{BL}_1$ is thus amplified to the full logic amplitude swing between Vcc and Vss.

A column decoder not shown in the drawings now selects the bit line pair $BL_1 \cdot \overline{BL}_1$ for output, thus reading the logic value that was stored in the memory cell $28_{1n}$ in FIG. 3. At the same time, the charges stored in the capacitors 30 in the memory cells $28_{1n}, \ldots, 28_{nn}$ are refreshed.

With reference to FIG. 5 again, suppose that the potential on the sense amplifier drive signal line PS does not rise smoothly to Vcc but fluctuates, as shown by the dashed line. Such fluctuations may occur due to flucuations in the power supply voltage, for example. As a result, the BL$_1$ line does not rise smoothly to Vcc but also fluctuates, as shown by the solid line in FIG. 5. In the prior art such a fluctuation could lead to latch-up. In the novel CMOS memory device, however, since the emitters and bases of the parasitic PNP transistors 66 and 68 in FIG. 4 are both connected to the sense amplifier drive signal line PS, they are always at the same potential. Hence the parasitic PNP transistors 66 and 68 do not turn on, and latch-up is avoided. This is the first advantage of the novel CMOS memory device.

Figure 1:
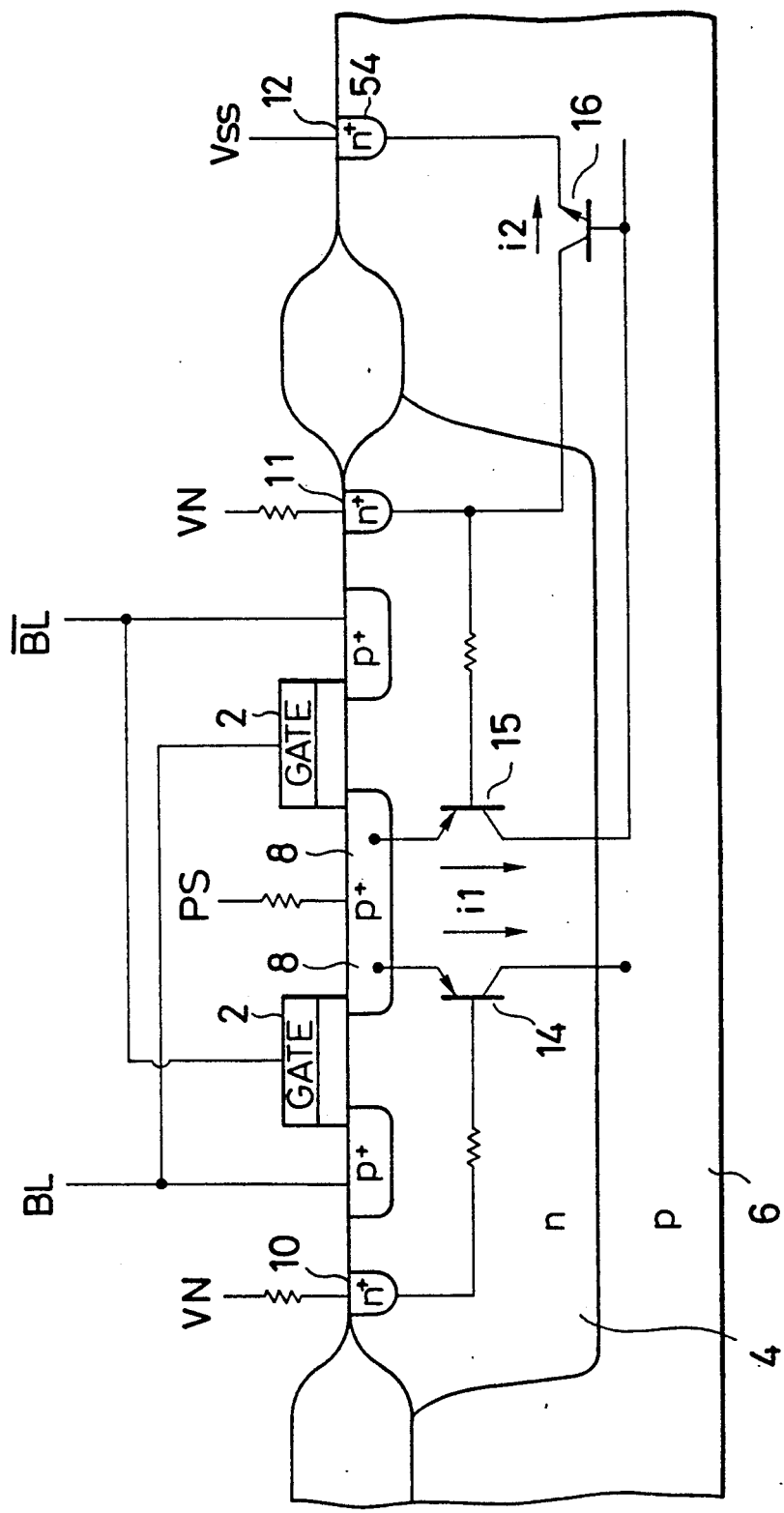
FIG. 1 is a sectional view of a prior-art sense amplifier, illustrating parasitic transistors and latch-up current.
Figure 2A:
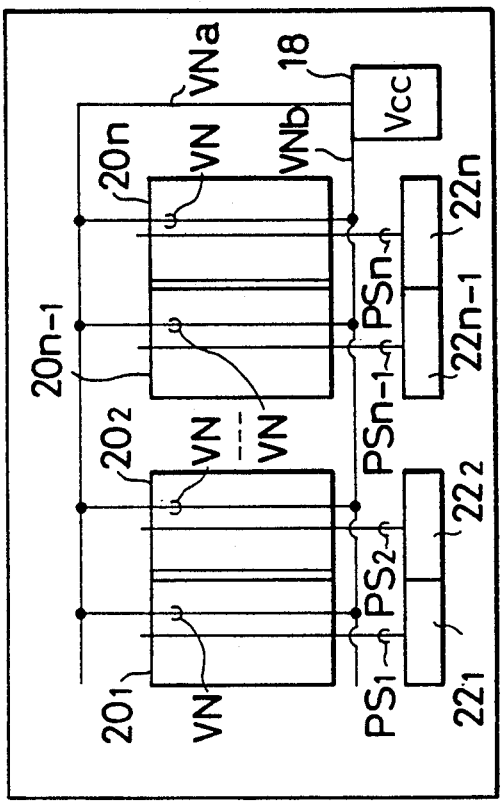
FIGS. 2A to 2D are plan views illustrating the biasing of sense amplifiers in prior-art CMOS memory devices.
Figure 2B:
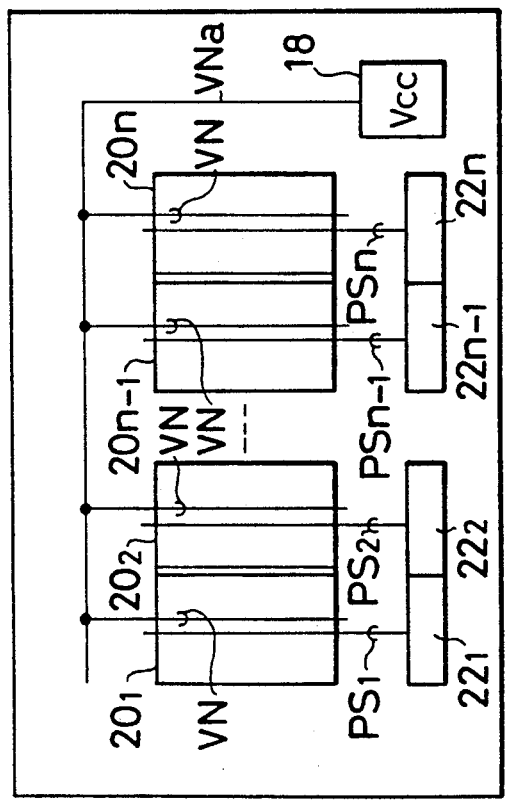

A second advantage is that special bias power lines such as VNa and VNb in FIGS. 2A and 2B are unnecessary, the biasing being accomplished from the sense amplifier drive signal line PS instead. The overall size of the device can therefore be reduced. Alternatively, the space saved by eliminating the bias power lines VNa and VNb can be exploited to increase the width of other power lines or signal lines to reduce their impedance, thereby increasing the operating speed of the device.

Figure 2D:
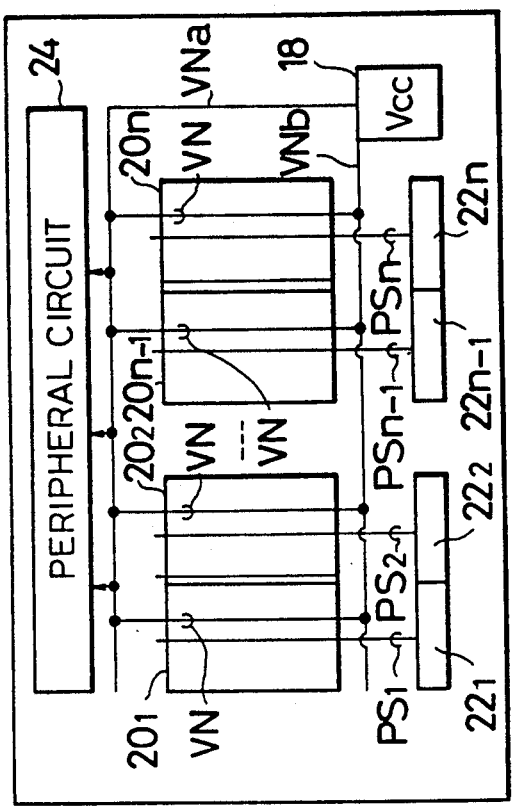
Figure 2C:
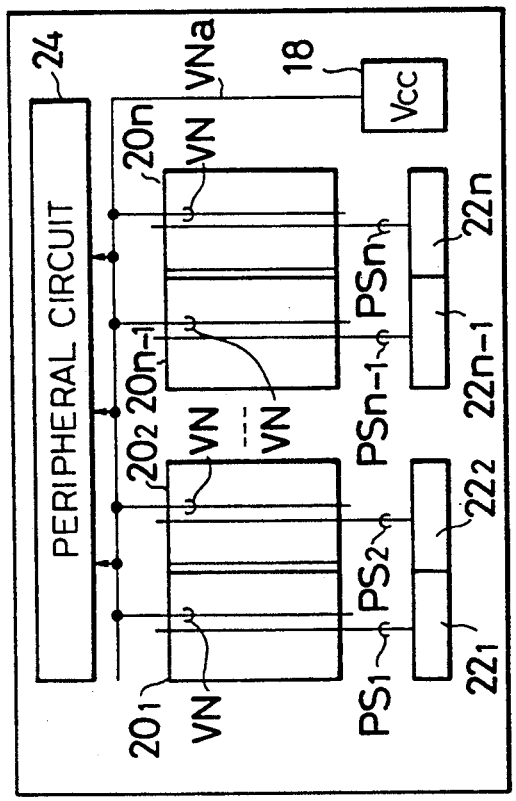

In circuit layouts such as those in FIGS. 2C and 2D, the power lines VNa and VNb can be used exclusively to power the peripheral circuits 24. Since these lines will not be subject to voltage drops associated with the biasing of sense amplifier wells, the peripheral circuits 24 will operate more reliably than in the prior art.

Because the sense amplifier drive signal line PS is connected to the n-well 50, its load capacitance is increased, which could conceivably reduce its signal propagation speed. Such reduction in speed can, however, easily be prevented: either by using part of the space saved by eliminating the VNa and VNb lines to widen the sense amplifier drive signal line PS, thus reducing its impedance; or by increasing the driving capability of the sense amplifier drive circuit 46 in FIG. 3.

The device illustrated in the drawings is a CMOS memory device with p-channel sense amplifiers disposed in n-wells in a p-type substrate, but with suitable modifications, which will be apparent to one skilled in the art, the illustrated device can be modified to make the invention applicable to any type of CMOS memory device having either a p-channel sense amplifier disposed in an n-well or an n-channel sense amplifier disposed in a p-well, regardless of whether the memory is of the dynamic or static type. Thus the sense amplifiers in general comprise MOS transistors, where MOS may be either PMOS or NMOS. Instead of being connected to the sources of the MOS transistors, the sense amplifier drive signal line PS can be connected to the drains of the MOS transistors, in which case the sources of the MOS transistors are connected to the bit lines. Other modifications, such as modifications in the number or disposition of the bias contacts in the n-wells, can also be made without departing from the spirit and scope of the invention, which should be judged solely from the appended claims.

What is claimed is:

1. A CMOS memory device fabricated on a substrate of a first conductive type, comprising:
   a memory cell array for storing data;
   a plurality of bit line pairs connected to said memory cell array, for output of said data;
   a plurality of wells of a second conductive type disposed in said substrate;
   a plurality of sense amplifiers connected to respective bit line pairs for amplifying potential differences on said bit line pairs, one sense amplifier being disposed in each well in said plurality of wells; and
   a sense amplifier drive signal line for driving said sense amplifiers, said sense amplifier drive signal line also being used to bias said wells.

2. The device of claim 1, wherein said first conductive type is p-type and said second conductive type is n-type.

3. The device of claim 1, wherein said first conductive type is n-type and said second conductive type is p-type.

4. The device of claim 1, wherein each sense amplifier of said plurality of sense amplifiers comprises, respectively:
   a first MOS transistor having a source connected to said sense amplifier drive signal line, a gate connected to a first bit line, and a drain connected to a second bit line, said source and said drain being of said first conductive type;
   a second MOS transistor having a source connected to said sense amplifier drive signal line, a gate connected to said second bit line, and a drain connected to said first bit line, said source and said drain being of said first conductive type; and
   a first bias contact connected to said sense amplifier drive signal line, for biasing the well containing said sense amplifier.

5. The device of claim 4, further comprising a second bias contact connected to said sense amplifier drive signal line, for biasing said well, said first MOS transistor and said second MOS transistor being disposed between said first bias contact and said second bias contact.

6. The device of claim 1, wherein each sense amplifier of said plurality of sense amplifiers comprises, respectively:
   a first MOS transistor having a drain connected to said sense amplifier drive signal line, a gate connected to a first bit line, and a source connected to a second bit line, said drain and said source being of said first conductive type;
   a second MOS transistor having a drain connected to said sense amplifier drive signal line, a gate connected to said second bit line, and a source connected to said first bit line, said drain and said source being of said first conductive type; and
   a first bias contact connected to said sense amplifier drive signal line, for biasing the well containing said sense amplifier.

7. The device of claim 6, further comprising a second bias contact connected to said sense amplifier drive signal line, for biasing said well, said first MOS transistor and said second MOS transistor being disposed between said first bias contact and said second bias contact.

8. A method of operating a CMOS memory device having memory cells for storing data, comprising the steps of storing data in the cells via bit lines, locating in wells sense amplifiers coupled to the bit lines, enabling the sense amplifiers with an enable signal, and biasing the wells with the enable signal to overcome latchup.

* * * * *